United States Patent
Yang et al.

(10) Patent No.: US 10,451,654 B2
(45) Date of Patent: Oct. 22, 2019

(54) PROBE CARD DEVICE

(71) Applicants: PRINCO CORP., Hsinchu (TW); TEK CROWN TECHNOLOGY CO., LTD., Taoyuan (TW)

(72) Inventors: Chih-kuang Yang, Hsinchu (TW); Yeong-yan Guu, Hsinchu (TW); Mou-I Lee, Taoyuan (TW)

(73) Assignees: PRINCO CORP., Hsinchu (TW); TEK CROWN TECHNOLOGY CO., LTD., Taoyuan (TW)

(*) Notice: Subject to any disclaimer, the term of this patent is extended or adjusted under 35 U.S.C. 154(b) by 169 days.

(21) Appl. No.: 15/606,905

(22) Filed: May 26, 2017

(65) Prior Publication Data
US 2017/0343582 A1    Nov. 30, 2017

Related U.S. Application Data

(60) Provisional application No. 62/343,500, filed on May 31, 2016.

(51) Int. Cl.
*G01R 1/073* (2006.01)
*G01R 3/00* (2006.01)
*G01R 31/28* (2006.01)

(52) U.S. Cl.
CPC ..... *G01R 1/07314* (2013.01); *G01R 1/07378* (2013.01); *G01R 3/00* (2013.01); *G01R 31/2889* (2013.01)

(58) Field of Classification Search
CPC ... G01R 3/00; G01R 1/07378; G01R 31/2889
See application file for complete search history.

(56) References Cited

U.S. PATENT DOCUMENTS

2004/0124519 A1* 7/2004 Zhou ............ G01R 1/07378
   257/686
2010/0219852 A1* 9/2010 Yamada ......... G01R 1/06722
   324/756.03

(Continued)

FOREIGN PATENT DOCUMENTS

| JP | 2002-134570 | 5/2002 |
| TW | M392351 U1 | 11/2010 |
| TW | M521177 U | 5/2016 |

OTHER PUBLICATIONS

Grace Chan et al., "C4 Probe Card Space Transformer Technology Overview", Southwest Test Workshop 2000, Jun. 12, 2000, XP055418912, Retrieved from the Internet: URL:http://www.swtest.org/swtw_library/2000proc/PDF/S04_Chan.pdf, [retrieved on Oct. 25, 2017], 24 pages.

(Continued)

*Primary Examiner* — Lee E Rodak
(74) *Attorney, Agent, or Firm* — Hauptman Ham, LLP

(57) ABSTRACT

A probe card device includes a plurality of pins; a thin film substrate including a plurality of first thin film connecting points and a plurality of second thin film connecting points, wherein at least one of the first thin film connecting points is electrically connected to at least one the second thin film connecting points, and a pitch of any two adjacent ones of the first film connecting points is less than a pitch of any two adjacent ones of the second film connecting points; and a circuit board including a plurality of first circuit board connecting points, wherein at least one of the second thin film connecting points is electrically connected to at least one of the first circuit board connecting points. The probe card device can enhance a layout function and a support function at the same time.

16 Claims, 7 Drawing Sheets

(56) References Cited

U.S. PATENT DOCUMENTS

| | | | |
|---|---|---|---|
| 2011/0024167 A1 | 2/2011 | Hashimoto | |
| 2012/0286817 A1* | 11/2012 | Duckworth | G01R 1/06738 324/755.01 |
| 2014/0091827 A1 | 4/2014 | Hung | |
| 2014/0224532 A1* | 8/2014 | Hashimoto | G01R 31/2886 174/258 |
| 2014/0232427 A1 | 8/2014 | Namburi et al. | |
| 2014/0262470 A1* | 9/2014 | Hsiao | H01L 24/11 174/267 |
| 2014/0327461 A1* | 11/2014 | Fan | G01R 1/06716 324/750.25 |
| 2015/0033553 A1* | 2/2015 | Wu | G01R 31/2887 29/831 |
| 2018/0364280 A1* | 12/2018 | Takemura | G01R 1/073 |

OTHER PUBLICATIONS

Kim Youngsoon et al., "Effects of Pad Surface Finish on Interfacial Reliabilities of Cu-pillar/Sn—Ag Bumps of 2.5D TSV—Enterposer on PCB Applications", 2014 IEEE 64th Electronic Components and Technology Conference (ECTC), IEEE, May 27, 2014, pp. 1765-1768, XP032642204, DOI: 10.1109/ECTC.2014.6897537 [retrieved on Sep. 11, 2014].

Chen Zhengrong et al., "Pad Finish Related Board-Level Solder Joint Reliability Research", Electronic Packaging Technology &High Density D8 Packaging (ICEPT-HDP), 2010 11th International Conference, IEEE, Piscataway, NJ, USA, Aug. 16, 2010, pp. 1039-1042, XP031761083, ISBN: 978-1-4244-8140-8.

Kelvin Pun et al., "ENEG and ENEPIG Surface Finish for Long Term Solderability", 2014 15th International Conference on D9 Electronic Packaging Technology, IEEE, Aug. 12, 2014, pp. 1-5, XP032658823, DOI: 10.1109/ICEPT.2014.6922552 [retrieved on Oct. 13, 2014].

Balazs Illes et al., "Investigating Whisker Growth on Immersion Tin Surface Finishing", Proceedings of the 36th International Spring Seminar on Electronics Technology, May 1, 2012, pp. 242-247, XP055419143, ISSN: 2161-2528, DOI: 10.1109/ISSE.2012. 6273080.

Jae-Myeong Kim et al., "Comparisons of Mechanical Reliabilities of Sn-3.0Ag-0.5Cu solder between ENIG and Immersion Sn Pad Finishes", Physical and Failure Analysis of Integrated Circuits (IPFA), 2011 18th IEEE International Symposium on the, IEEE, Jul. 4, 2011, pp. 1-4, XP032036267, DOI: 10.1109/IPFA.2011.5992741 ISBN: 978-1-4577-0159-7.

Hetschel T et al., "Wettability Effects of Immersion Tin Final Finishes with Lead Free Solder", Electronics Systemintegration Technology D12 Conference, 2008. ESTC 2008. 2nd, IEEE, Piscataway, NJ, USA, Sep. 1, 2008, pp. 561-566, XP031669146, ISBN: 978-1-4244-2813-7.

* cited by examiner

PROBE CARD DEVICE

CROSS REFERENCE TO RELATED APPLICATION

This patent application claims priority of U.S. Provisional Application Ser. No. 62/343,500, entitled "PROBE CARD", which is filed on May 31, 2016, incorporated herein by reference.

BACKGROUND OF THE INVENTION

Field of Invention

The present disclosure relates to a test field, and more particularly to a probe card device.

Description of Prior Art

Please refer to FIG. 1. FIG. 1 shows a longitudinal section view of a probe card device 10 in the prior art.

The probe card device 10 includes a probe head 100, a transforming plate 102, an interposer 104, a circuit board 106, and a stiffener 108.

The probe head 100 is electrically connected to the transforming plate 102 and includes a plurality of pins 110.

The transforming plate 102 is also called a multi-layer organic (MLO) substrate or a multi-layer ceramic (MLC) substrate. The transforming plate 102 is electrically connected to the probe head 100 and the interposer 104. The transforming plate 102 is used for electrically connecting the pins 110 with narrow pitches to interposer elements 112 of the interposer 104 with wide pitches. That is, the transforming plate 102 is regarded as a space transformer.

The interposer 104 is electrically connected to the circuit board 106. The interposer 104 is used for jointing the transforming plate 102 to the circuit board 106.

The circuit board 106 is fixed on the stiffener 108. The circuit board 102 is used for transmitting at least one test signal of a test system (not shown). The at least one test signal is transmitted to the pins 110 via the interposer elements 112 of the interposer 104 and the transforming plate 102. The pins 110 contact chip contacts of a wafer (not shown) for electrically testing the chip contacts.

In the above-mentioned probe card device 10, the transforming plate 102 has a layout function and a support function. The layout function is used for electrically connecting the pins 110 with the narrow pitches to the interposer elements 112 of the interposer 104 with the wide pitches. The support function is used for providing a sufficient support force when the pins 110 contact the chip contacts of the wafer (not shown). When the transforming plate 102 is made of a hard material, the support function can be enhanced. However, a layout density is limited due to the hard material (the pitches cannot be decreased). That is, the layout function is worse. On the other hand, when the transforming plate 102 is made of a soft material, the support function is decreased. Specifically, when the support function is enhanced, the layout function is worsened. When the layout function is enhanced, the support function is worsened.

Consequently, there is a need to solve the problem of the probe card device in the prior art.

SUMMARY OF THE INVENTION

The present disclosure provides a probe card device capable of solving the problem in the prior art.

The probe card device in accordance with the present disclosure includes a probe head comprising a plurality of pins; a thin film substrate comprising a thin film body, a plurality of first thin film connecting points formed on a first surface of the thin film body, a plurality of second thin film connecting points formed on a second surface of the thin film body, and at least one inner metal layer disposed in the thin film body, wherein at least one of the first thin film connecting points is electrically connected to at least one of the second thin film connecting points via the at least one inner metal layer of the thin film substrate, a pitch between any two adjacent ones of the first thin film connecting points is less than a pitch between any two adjacent ones of the second thin film connecting points, and one terminal of each of the pins is electrically connected to one of the first thin film connecting points; a circuit board comprising a circuit board body, a plurality of first circuit board connecting points formed on a first surface of the circuit board body, and a plurality of second circuit board connecting points formed on a second surface of the circuit board body, wherein at least one of the second thin film connecting points is electrically connected to at least one of the first circuit board connecting points; and an underfill filled between the thin film substrate and the circuit board.

The probe card device in accordance with the present disclosure includes a probe head comprising a plurality of pins; a thin film substrate comprising a thin film body, a plurality of first thin film connecting points formed on a first surface of the thin film body, a plurality of second thin film connecting points formed on a second surface of the thin film body, and at least one inner metal layer disposed in the thin film body, wherein at least one of the first thin film connecting points is electrically connected to at least one of the second thin film connecting points via the at least one inner metal layer of the thin film substrate, a pitch between any two adjacent ones of the first thin film connecting points is less than a pitch between any two adjacent ones of the second thin film connecting points, and one terminal of each of the pins is electrically connected to one of the first thin film connecting points; a device under test board comprising a device under test board body, a plurality of first device under test board connecting points formed on a first surface of the device under test board body, a plurality of second device under test board connecting points formed on a second surface of the device under test board body, and at least one inner metal layer disposed in the device under test body, wherein at least one of the second thin film connecting points is electrically connected to at least one of the first device under test board connecting points, and the at least one of the first device under test board connecting points is electrically connected to at least one of the second device under test board connecting points via the inner metal layer of the device under test board; a circuit board electrically connected to the at least one of the second device under test board connecting points; and an underfill filled between the thin film substrate and the device under test board.

In the probe card device in accordance with the present disclosure, since the layout function and the support function are provided by different elements, the layout function and the support function can be enhanced at the same time.

DETAILED DESCRIPTION OF THE PREFERRED EMBODIMENTS

Figure 2:
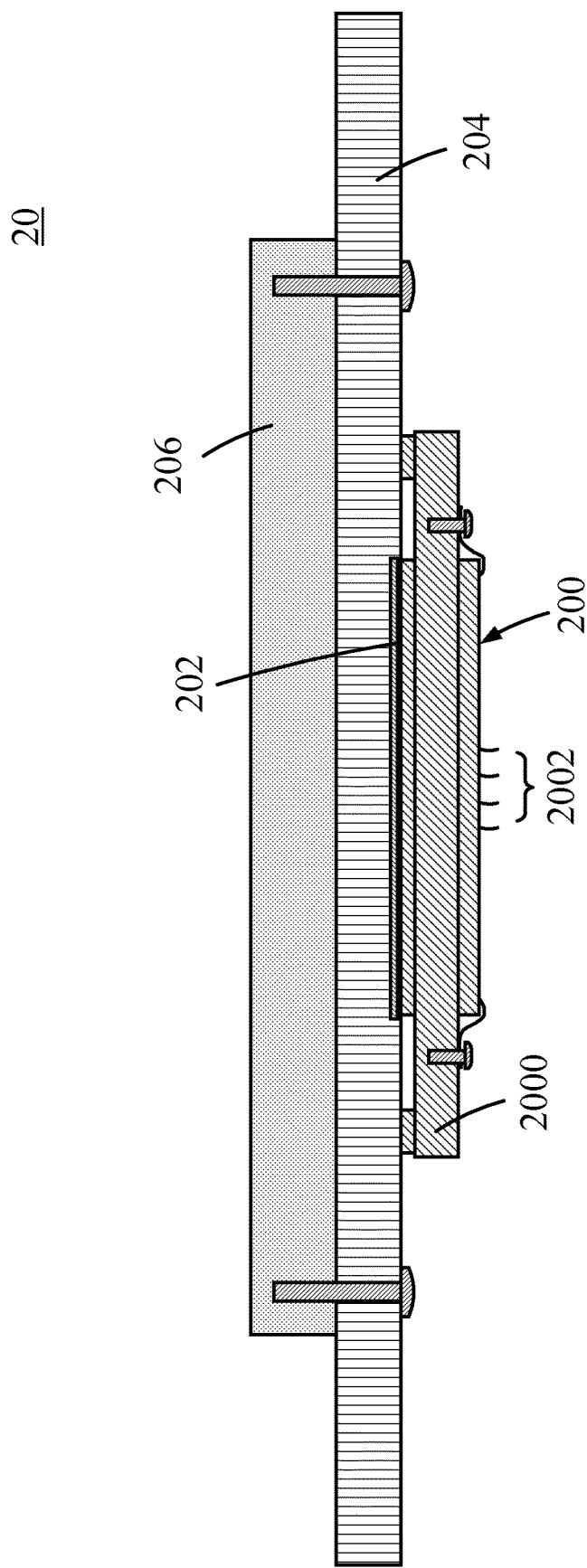
FIG. 2 shows a longitudinal section view of a probe card device in accordance with an embodiment of the present disclosure.

Please refer to FIG. 2. FIG. 2 shows a longitudinal section view of a probe card device 20 in accordance with an embodiment of the present disclosure.

The probe card device 20 includes a probe head 200, a thin film substrate 202, a circuit board 204, and a stiffener 206.

The probe head 200 includes a housing 2000 and a plurality of pins 2002. The pins 2002 are disposed in the housing 2000 and pass through the housing 2000.

Figure 3:
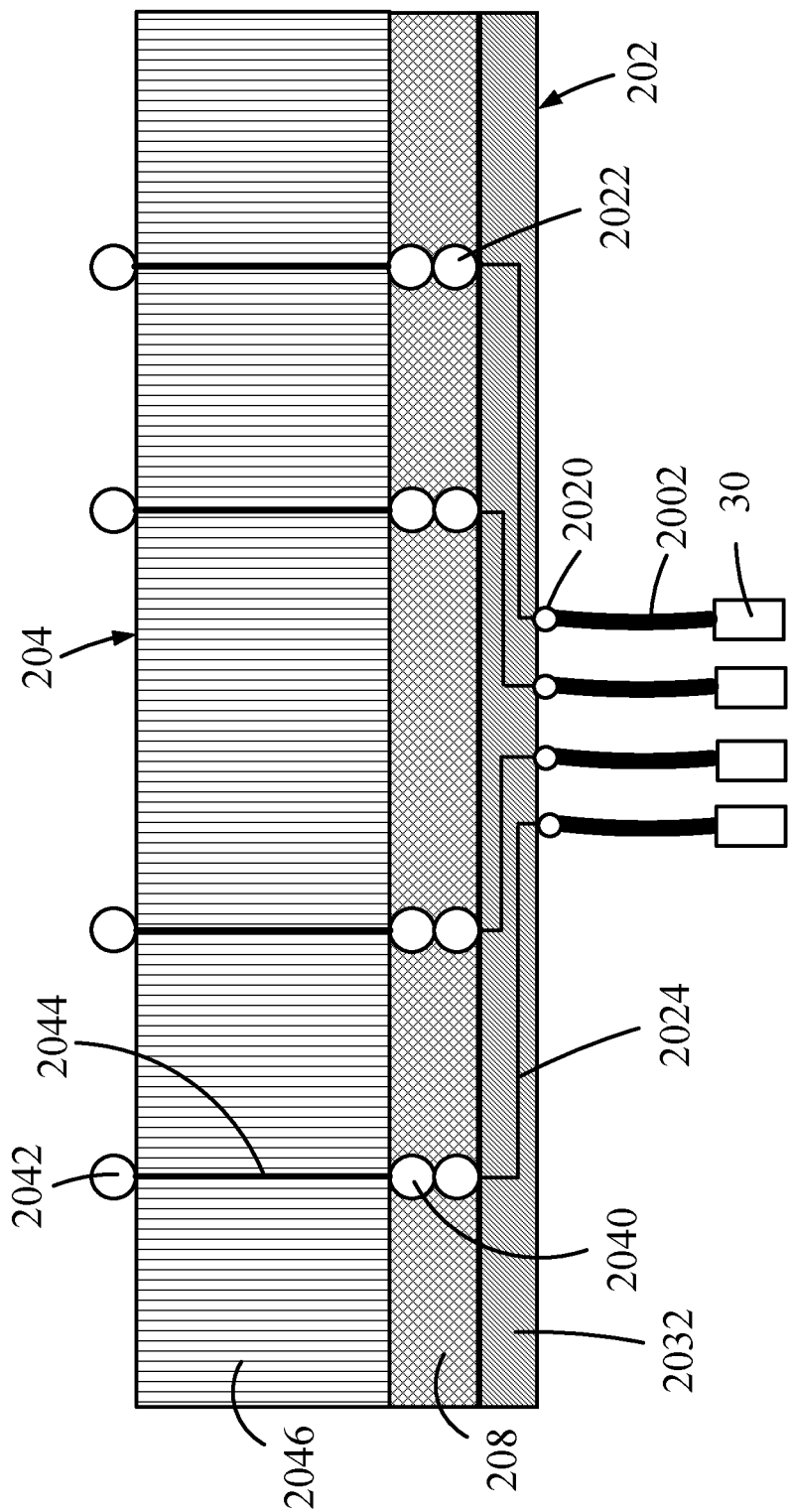
FIG. 3 shows pins, a thin film substrate, and a circuit board in FIG. 2.

Please refer to FIG. 2 and FIG. 3. FIG. 3 shows the pins 2002, the thin film substrate 202, and the circuit board 204 in FIG. 2.

The thin film substrate 202 includes a thin film body 2032, a plurality of first thin film connecting points 2020 formed on a first surface of the thin film body 2032, a plurality of second thin film connecting points 2022 formed on a second surface of the thin film body 2032, and at least one inner metal layer 2024 disposed in the thin film body 2032. At least one of the first thin film connecting points 2020 is electrically connected to at least one of the second thin film connecting points 2022 via the at least one inner metal layer 2024. A pitch between any two adjacent ones of the first thin film connecting points 2020 is less than a pitch between any two adjacent ones of the second thin film connecting points 2022.

Figure 1:
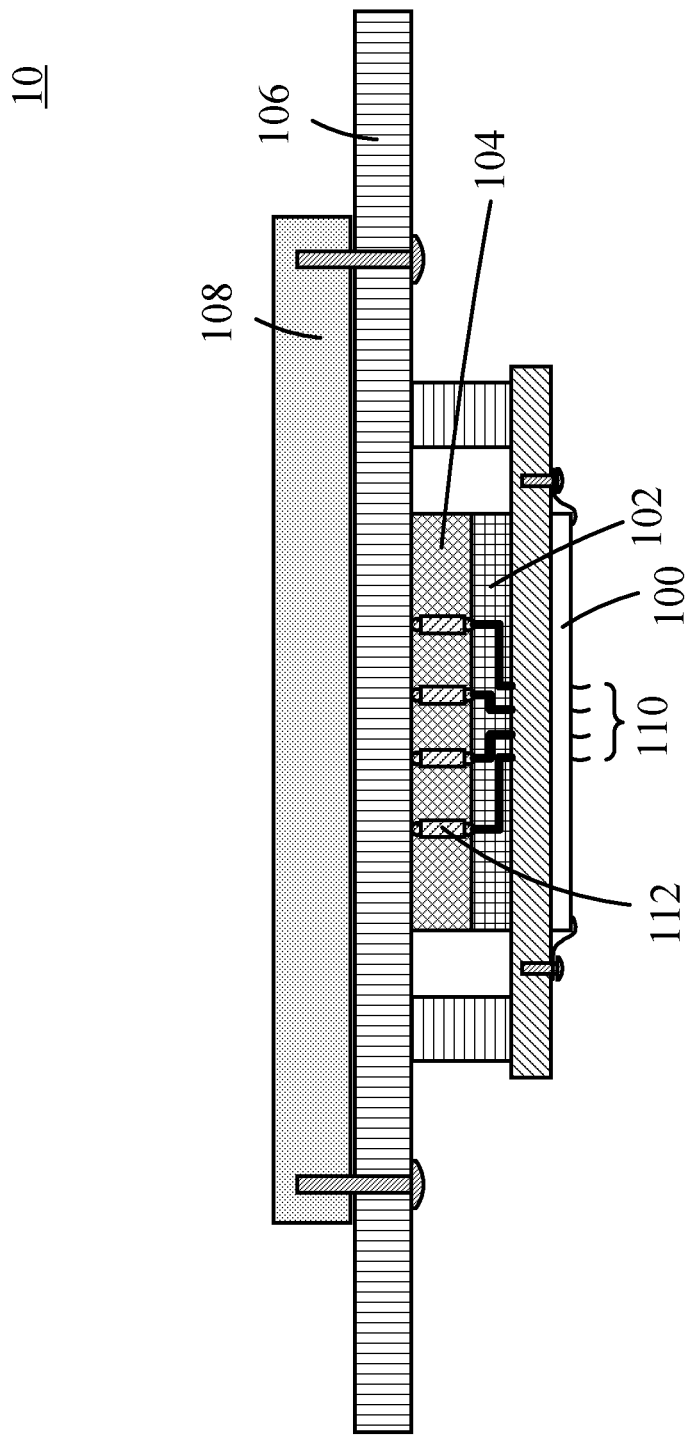
FIG. 1 shows a longitudinal section view of a probe card device in the prior art.

The thin film substrate 202 is used for electrically connecting the pins 2020 with narrow pitches to the circuit board 204 with wide pitches. That is, the thin film substrate 202 functions the same as the transforming plate 102 in FIG. 1.

In the probe card device 20 in accordance with the present disclosure, the thin film substrate 202 provides a layout function, and the circuit board 204 provides a support function. Since the layout function and the support function are provided by different elements, the layout function and the support function can be enhanced at the same time.

A surface of each of the first thin film connecting points 2020 includes an electroless nickel electroless palladium and immersion gold (ENEPIG), an electroless nickel immersion gold (ENIG), or an organic solderability preservative (OSP). A surface of each of the second thin film connecting points 2022 includes an electroless nickel electroless palladium and immersion gold (ENEPIG), an electroless nickel immersion gold (ENIG), or an organic solderability preservative (OSP).

In one embodiment, each of the second thin film connecting points 2022 may be a solder ball. In another embodiment, each of the second thin film connecting points 2022 may have a complex welding structure. Specifically, each of the second thin film connecting points 2022 includes a metal material and a tin material coating the metal material.

One terminal of each of the pins 2002 is electrically connected to one of the first thin film connecting points 2020, and the other terminal of each of the pins 2002 is electrically connected to a chip contact 30. The chip contact 30 is a contact of a chip to be tested.

The circuit board 204 includes a circuit board body 2046, a plurality of first circuit board connecting points 2040 formed on a first surface of the circuit board body 2046, and a plurality of second circuit board connecting points 2042 formed on a second surface of the circuit board body 2046. At least one of the second thin film connecting points 2022 is electrically connected to at least one of the first circuit board connecting points 2040. At least one of the first circuit board connecting points 2040 is electrically connected to at least one of the second circuit board connecting points 2042 via at least one inner metal layer 2044.

Furthermore, in the probe card device 20 in accordance with the present disclosure, an underfill 208 is filled between the thin film substrate 202 and the circuit board 204. The underfill 208 coats the second thin film connecting points 2022 and the first circuit board connecting points 2040.

As shown in FIG. 2, the circuit board 204 is fixed on the stiffener 206. The circuit board 204 is used for transmitting at least one test signal of a test system (not shown). The at least one test signal is transmitted to the pins 2002 via the thin film substrate 202. The pins 2002 contact the chip contacts 30 in FIG. 3 for electrically testing the chip contacts 30.

When the probe card device 20 performs a test, the pins 2002 require applying forces to the chip contacts 30 to contact the chip contacts. Generally, a force of each of the pins 2002 is ranged from 2 gram weights (gw) to 6 gram weights. When the probe card device 20 includes 5000 pins 2002, a total force is ranged from 10 kilogram weights (kgw) to 30 kilogram weights. The thin film substrate 202 and the circuit board 204 also bear the same force. If a rigidity of the circuit board 204 is not sufficient to support the force, the stiffener 206 can be strengthened to support the probe card device 20.

Figure 4:
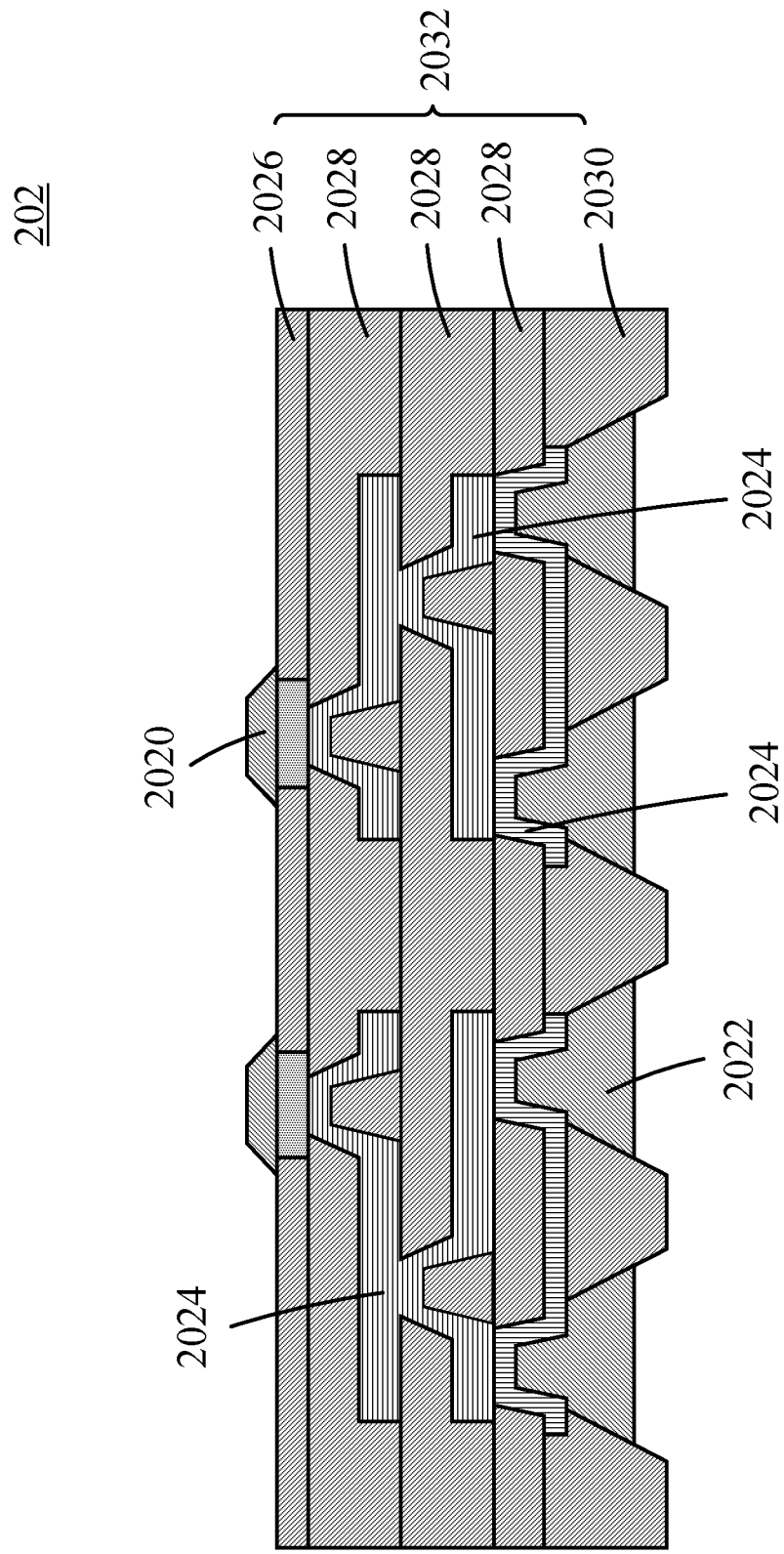
FIG. 4 shows the thin film substrate in accordance with an embodiment of the present disclosure.

Please refer to FIG. 2 to FIG. 4. FIG. 4 shows the thin film substrate 202 in accordance with an embodiment of the present disclosure.

The thin film substrate 202 includes a thin film body 2032, the first thin film connecting points 2020, the at least one inner metal layer 2024, and the second thin film connecting points 2022. The thin film body 2032 includes a first surface dielectric layer 2026, at least one inner dielectric layer 2028, and a second surface dielectric layer 2030. In the present embodiment, the thin film substrate 202 includes three inner metal layers 2024 and three inner dielectric layers 2028, but the present disclosure is not limited thereto.

The first thin film connecting points 2020 are formed in the first surface dielectric layer 2026, each of the inner metal layers 2024 is formed in a corresponding one of the inner dielectric layers 2028, and the second thin film connecting points 2022 are formed in the second surface dielectric layer 2030. At least one of the first thin film connecting points 2020 is electrically connected to at least one of the second thin film connecting points 2022 via the inner metal layers 2024.

The first thin film connecting points 2020'protrude from a first surface of the thin film body 2032'. The first thin film connecting points 2020 are applicable in a situation that a bottom size of at least one of the pins 2002'in FIG. 3 is larger than a dimension of at least one of the first thin film connecting points 2020'.

The thin film substrate 202 may include 4 layers to 20 layers. A thickness of each of the first surface dielectric layer 2026, the at least one inner dielectric layer 2028, and the second surface dielectric layer 2030 is ranged from 5 micrometers (μm) to 20 μm. The first surface dielectric layer 2026, the at least one inner dielectric layer 2028, and the second surface dielectric layer 2030 are made of polyimide. A height of each of the first thin film connecting points 2020, a thickness of the at least one inner metal layer 2024, and a height of each of the second thin film connecting points 2022 is ranged from 1 μm to 10 μm. A line width of the at least one inner metal layer 2024 is ranged from 2 μm to 100 μm. It is noted that the at least one inner metal layer 2024 may be a whole surface metal layer to be served as a power layer or a ground layer. A via size of the at least one inner metal layer 2024 is ranged from 10 μm to 50 μm.

A material of the circuit board body 2046 may be an organic material or a ceramic material. When the circuit board body 2046 is made of the ceramic material, the circuit board 204 has a larger Young's modulus. When the pins 2002 apply the forces to contact the chip contacts 30, the ceramic material is not bent easily and thus can provide a better support function. A line width of at least one metal layer of the circuit board 204 is greater than 50 μm. A via size of the at least one metal layer of the circuit board 204 is greater than 50 μm. A total thickness of the circuit board 204 is greater than 2 millimeters (mm).

Figure 5:
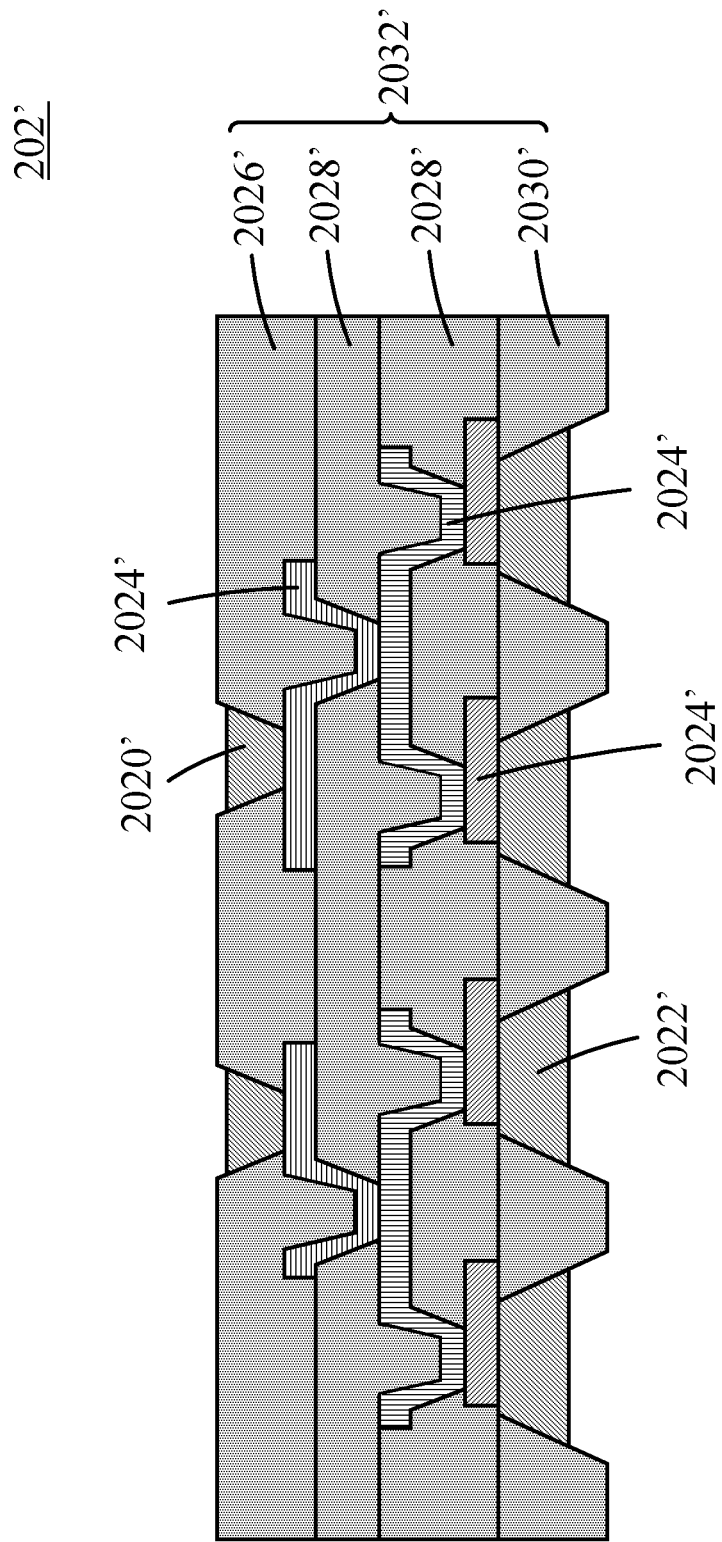
FIG. 5 shows another thin film substrate in accordance with another embodiment of the present disclosure.

Please refer to FIG. 2 to FIG. 3 and FIG. 5. FIG. 5 shows another thin film substrate 202' in accordance with another embodiment of the present disclosure.

The thin film substrate 202' includes a thin film body 2032', a plurality of first thin film connecting points 2020', at least one inner metal layer 2024', and a plurality of second thin film connecting points 2022'. The thin film body 2032' includes a first surface dielectric layer 2026', at least one inner dielectric layer 2028', and a second surface dielectric layer 2030'. In the present embodiment, the thin film substrate 202' includes three inner metal layers 2022' and two inner dielectric layers 2028', but the present disclosure is not limited thereto.

The first thin film connecting points 2020' are formed in the first surface dielectric layer 2026', each of the inner metal layers 2024' is formed in a corresponding one of the inner dielectric layers 2028', and the second thin film connecting points 2022' are formed in the second surface dielectric layer 2030'. At least one of the first thin film connecting points 2020' is electrically connected to at least one of the second thin film connecting points 2022' via the inner metal layers 2024' (corresponding to the inner metal layer 2024).

The first thin film connecting points 2020' are lower than a first surface of the thin film body 2032'. The first thin film connecting points 2020'are applicable in a situation that a bottom size of at least one of the pins 2002 in FIG. 3 is smaller than a dimension of at least one of the first thin film connecting points 2020'.

It is noted that a number of the layers, thicknesses, the materials, the heights, the line widths described in FIG. 4 can be applicable to the present embodiment and are not repeated herein.

Figure 6:
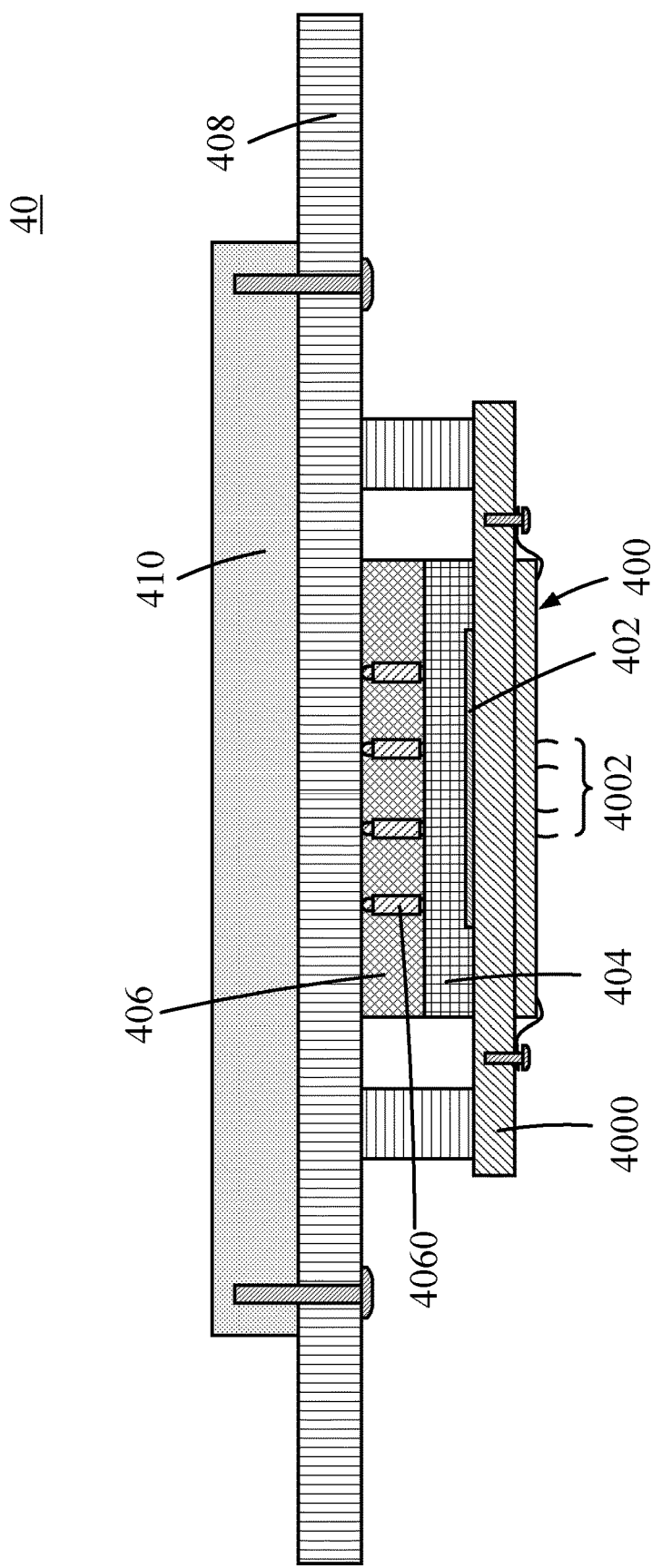
FIG. 6 shows a longitudinal section view of a probe card device in accordance with another embodiment of the present disclosure.

Please refer to FIG. 6. FIG. 6 shows a longitudinal section view of a probe card device 40 in accordance with another embodiment of the present disclosure.

The probe card device 40 includes a probe head 400, a thin film substrate 402, a device under test board (Dut board) 404, an interposer 406, a circuit board 408, and a stiffener 410.

The probe head 400 includes a housing 4000 and a plurality of pins 4002. The pins 4002 are disposed in the housing 4000 and pass through the housing 4000.

Figure 7:
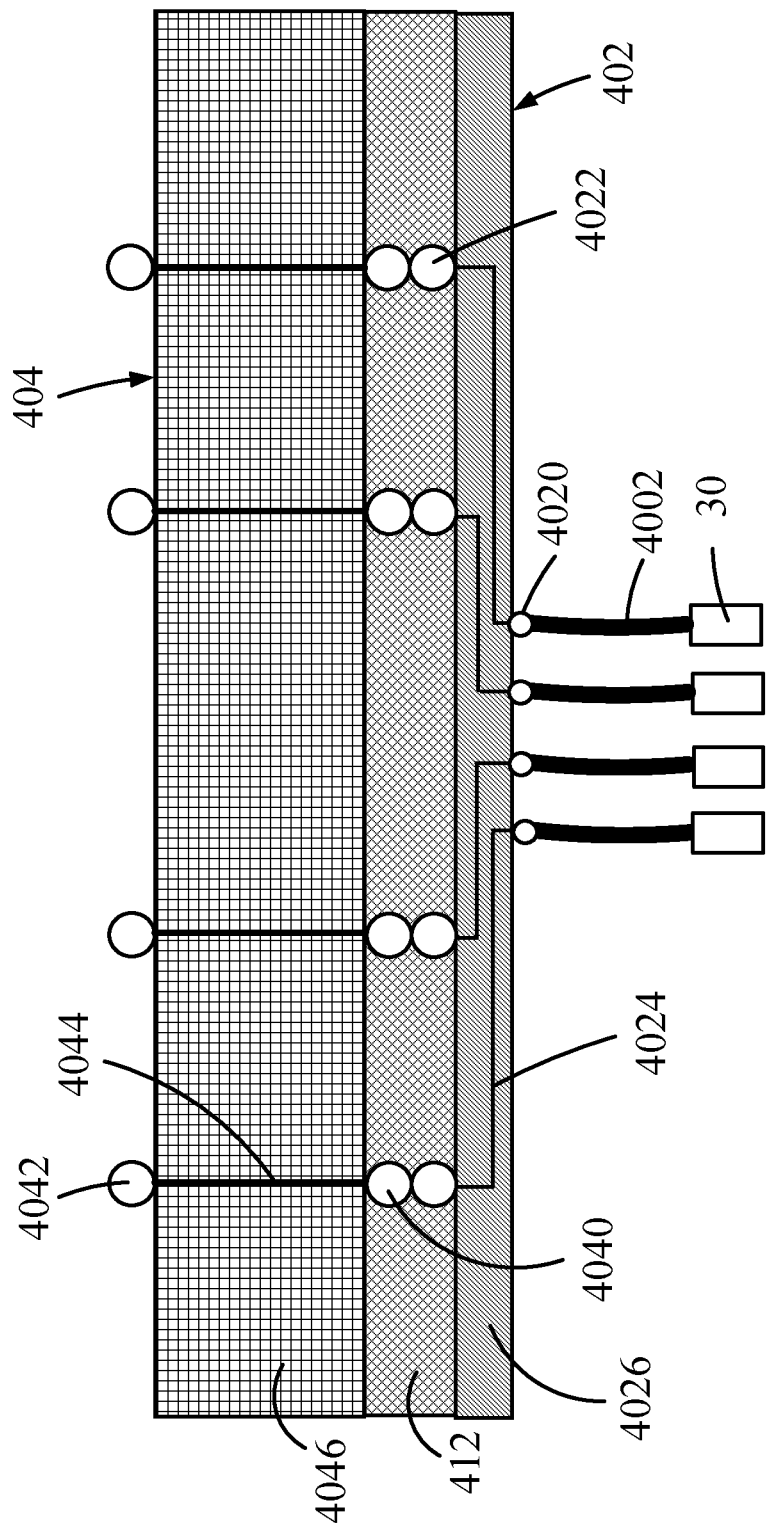
FIG. 7 shows pins, a thin film substrate, and a device under test board in FIG. 6.

Please refer to FIG. 6 and FIG. 7. FIG. 7 shows the pins 4002, the thin film substrate 402, and the device under test board 404 in FIG. 6.

The thin film substrate 402 includes a thin film body 4026, a plurality of first thin film connecting points 4020 formed on a first surface of the thin film body 4026, a plurality of second thin film connecting points 4022 formed on a second surface of the thin film body 4026, and at least one inner metal layer 4024 disposed in the thin film body 4026. At least one of the first thin film connecting points 4020 is electrically connected to at least one of the second thin film connecting points 4022 via the at least one inner metal layer 4024. A pitch between any two adjacent ones of the first thin film connecting points 4020 is less than a pitch between any two adjacent ones of the second thin film connecting points 4022.

The thin film substrate 402 is used for electrically connecting the pins 4020 with narrow pitches to the device under test board 404 with wide pitches. That is, the thin film substrate 402 functions the same as the transforming plate 102 in FIG. 1.

In the probe card device 40 in accordance with the present disclosure, the thin film substrate 402 provides a layout function, and the device under test board 404 provides a support function. Since the layout function and the support function are provided by different elements, the layout function and the support function can be enhanced at the same time.

A surface of each of the first thin film connecting points 4020 includes an electroless nickel electroless palladium and immersion gold (ENEPIG), an electroless nickel immersion gold (ENIG), or an organic solderability preservative (OSP). A surface of each of the second thin film connecting points 4022 includes an electroless nickel electroless palladium and immersion gold (ENEPIG), an electroless nickel immersion gold (ENIG), or an organic solderability preservative (OSP).

In one embodiment, each of the second thin film connecting points 4022 may be a solder ball. In another embodiment, each of the second thin film connecting points 4022 may have a complex welding structure. Specifically, each of the second thin film connecting points 4022 includes a metal material and a tin material coating the metal material.

One terminal of each of the pins 4002 is electrically connected to one of the first thin film connecting points 4020, and the other terminal of each of the pins 4002 is electrically connected to a chip contact 30. The chip contact 30 is a contact of a chip to be tested.

The device under test board 404 includes a device under test body 4046, a plurality of first device under test board connecting points 4040 formed on a first surface of the device under test board body 4046, a plurality of second device under test board connecting points 4042 formed on a second surface of the device under test board body 4046, and at least one inner metal layer 4044 disposed in the device under test board 4046. At least one of the second thin film connecting points 4022 is electrically connected to at least one of the first device under test board connecting points 4040. At least one of the first device under test board connecting points 4040 is electrically connected to at least one of the second device under test board connecting points 4042 via the at least one inner metal layer 4044. The at least one of the second device under test board connecting points 4042 is electrically connected to the circuit board 408 via the interposer 406 in FIG. 6. The interposer 406 is disposed between the device under test board 404 and the circuit board 408 and used for electrically connecting the circuit board 408 to the device under test board 404.

A material of the device under test board body 4046 may be an organic material or a ceramic material. When the device under test board body 4046 is made of the ceramic material, the device under test board 404 has a larger Young's modulus. When the pins 4002 apply forces to contact the chip contacts 30, the ceramic material is not bent easily and thus can provide a better support function. Since the layout is completed in the thin film substrate 402, the at least one inner metal layer 4044 of the device under test board 404 may only include a plurality of vertical vias. For example, the at least one inner metal layer 4044 may only include a plurality of plated-through holes (PTHs) or include vias including a metal material formed therein. As a result, the device under test board 404 does not require a layout layer, thereby simplifying a structure to achieve the objective the present disclosure that the layout function and the support function are enhanced at the same time.

Furthermore, in the probe card device 40 in accordance with the present disclosure, an underfill 412 is filled between the thin film substrate 402 and the device under test board 404. The underfill 412 coats the second thin film connecting points 4022 and the first device under test board connecting points 4040.

As shown in FIG. 6, the device under test board 404 is fixed on the stiffener 410. The circuit board 408 is used for transmitting at least one test signal of a test system (not shown). The at least one test signal is transmitted to the pins 4002 via interposer elements 4060 of the interposer 406, the device under test board 404, and the thin film substrate 402. The pins 4002 contact the chip contacts 30 in FIG. 7 for electrically testing the chip contacts 30.

It is noted in the probe card device in accordance with the present disclosure, the interposer 60 is an optional element. When the interposer 60 is not used, the circuit board 408 is directly electrically connected to the at least one of the second device under test board connecting points 4042. A distance between circuit board 408 and the housing 4000 can be fixed by increasing a thickness of the device under test board 404, and thus it is not necessary to modify the mechanical design of other elements.

Furthermore, a specific structure of the thin film substrate 402 can refer to the corresponding descriptions in FIG. 4 and FIG. 5 and is not repeated herein.

In the probe card device in accordance with the present disclosure, since the layout function and the support function are provided by different elements, the layout function and the support function can be enhanced at the same time. Furthermore, in the probe card device in accordance with the present disclosure, the thin film substrate is used as a space transformer, so that line widths, line pitches, and noises can be decreased and a thickness of the probe card device can be reduced.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A probe card device, comprising:
   a probe head comprising a plurality of pins;
   a thin film substrate comprising a thin film body, a plurality of first thin film connecting points formed on a first surface of the thin film body, a plurality of second thin film connecting points formed on a second surface of the thin film body, and at least one inner metal layer disposed in the thin film body, wherein at least one of the first thin film connecting points is electrically connected to at least one of the second thin film connecting points via the at least one inner metal layer of the thin film substrate, a pitch between any two adjacent ones of the first thin film connecting points is less than a pitch between any two adjacent ones of the second thin film connecting points, and one terminal of each of the pins is electrically connected to one of the first thin film connecting points;
   a circuit board comprising a circuit board body, a plurality of first circuit board connecting points formed on a first surface of the circuit board body, and a plurality of second circuit board connecting points formed on a second surface of the circuit board body, wherein at least one of the second thin film connecting points is electrically connected to at least one of the first circuit board connecting points; and
   an underfill filled between the thin film substrate and the circuit board,
   wherein the thin film body comprises:
   a first surface dielectric layer, the first thin film connecting points formed in the first surface dielectric layer, wherein a whole of each of the first thin film connecting points is positioned within the first surface dielectric layer;
   at least one inner dielectric layer, the at least one inner metal layer formed in the at least one inner dielectric layer; and
   a second surface dielectric layer, the second thin film connecting points formed in the second surface dielectric layer,
   wherein a thickness of each of the first surface dielectric layer, the at least one inner dielectric layer, and the second surface dielectric layer is ranged from 5 micrometers to 20 micrometers.

2. The probe card device of claim 1, wherein the probe head further comprises a housing, and the pins pass through the housing.

3. The probe card device of claim 1, wherein a surface of each of the first thin film connecting points comprises an electroless nickel electroless palladium and immersion gold (ENEPIG), an electroless nickel immersion gold (ENIG), or an organic solderability preservative (OSP).

4. The probe card device of claim 1, wherein a surface of each of the second thin film connecting points comprises an electroless nickel electroless palladium and immersion gold (ENEPIG), an electroless nickel immersion gold (ENIG), or an organic solderability preservative (OSP).

5. The probe card device of claim 1, wherein each of the second thin film connecting points comprises a metal material and a tin material coating the metal material.

6. The probe card device of claim 1, further comprising:
   a stiffener, the circuit board fixed on the stiffener.

7. The probe card device of claim 1, wherein a material of the circuit board body is a ceramic material.

8. A probe card device, comprising:
   a probe head comprising a plurality of pins;
   a thin film substrate comprising a thin film body, a plurality of first thin film connecting points formed on a first surface of the thin film body, a plurality of second thin film connecting points formed on a second surface of the thin film body, and at least one inner metal layer disposed in the thin film body, wherein at least one of the first thin film connecting points is electrically connected to at least one of the second thin film connecting points via the at least one inner metal layer of the thin film substrate, a pitch between any two adjacent ones of the first thin film connecting points is less than a pitch between any two adjacent ones of the second thin film connecting points, and one terminal of each of the pins is electrically connected to one of the first thin film connecting points;

a device under test board comprising a device under test board body, a plurality of first device under test board connecting points formed on a first surface of the device under test board body, a plurality of second device under test board connecting points formed on a second surface of the device under test board body, and at least one inner metal layer disposed in the device under test body, wherein at least one of the second thin film connecting points is electrically connected to at least one of the first device under test board connecting points, and the at least one of the first device under test board connecting points is electrically connected to at least one of the second device under test board connecting points via the inner metal layer of the device under test board;

a circuit board electrically connected to the at least one of the second device under test board connecting points; and an underfill filled between the thin film substrate and the device under test board, wherein the thin film body comprises:

a first surface dielectric layer, the first thin film connecting points formed in the first surface dielectric layer, wherein a whole of each of the first thin film connecting points is positioned within the first surface dielectric layer;

at least one inner dielectric layer, the at least one inner metal layer formed in the at least one inner dielectric layer; and a second surface dielectric layer, the second thin film connecting points formed in the second surface dielectric layer, wherein a thickness of each of the first surface dielectric layer, the at least one inner dielectric layer, and the second surface dielectric layer is ranged from 5 micrometers to 20 micrometers.

9. The probe card device of claim 8, wherein the probe head further comprises a housing, and the pins pass through the housing.

10. The probe card device of claim 8, wherein a surface of each of the first thin film connecting points comprises an electroless nickel electroless palladium and immersion gold (ENEPIG), an electroless nickel immersion gold (ENIG), or an organic solderability preservative (OSP).

11. The probe card device of claim 8, wherein a surface of each of the second thin film connecting points comprises an electroless nickel electroless palladium and immersion gold (ENEPIG), an electroless nickel immersion gold (ENIG), or an organic solderability preservative (OSP).

12. The probe card device of claim 8, wherein each of the second thin film connecting points comprises a metal material and a tin material coating the metal material.

13. The probe card device of claim 8, further comprising: a stiffener, the circuit board fixed on the stiffener.

14. The probe card device of claim 8, further comprising: an interposer disposed between the device under test board and the circuit board and used for electrically connecting the circuit board to the device under test board.

15. The probe card device of claim 8, wherein the at least one inner metal layer of the device under test board only comprises a plurality of vertical vias.

16. The probe card device of claim 8, wherein a material of the device under test board body is a ceramic material.

* * * * *